US011587986B2

(12) United States Patent
Kim et al.

(10) Patent No.: US 11,587,986 B2
(45) Date of Patent: Feb. 21, 2023

(54) ORGANIC LIGHT EMITTING DISPLAY DEVICE INCLUDING REFLECTION STRUCTURE

(71) Applicant: LG Display Co., Ltd., Seoul (KR)

(72) Inventors: Jong-Sung Kim, Paju-si (KR); Tae-Han Park, Paju-si (KR); Ho-Won Choi, Paju-si (KR); Dong-Young Kim, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 276 days.

(21) Appl. No.: 17/001,369

(22) Filed: Aug. 24, 2020

(65) Prior Publication Data
US 2021/0066406 A1    Mar. 4, 2021

(30) Foreign Application Priority Data
Aug. 27, 2019 (KR) ................. 10-2019-0105182

(51) Int. Cl.
    *H01L 27/32*        (2006.01)
    *H01L 51/52*        (2006.01)

(52) U.S. Cl.
    CPC ...... *H01L 27/3218* (2013.01); *H01L 27/3246* (2013.01); *H01L 51/5218* (2013.01); *H01L 51/5237* (2013.01); *H01L 51/5271* (2013.01); *H01L 51/5284* (2013.01)

(58) Field of Classification Search
USPC ....................................................... 257/40
See application file for complete search history.

(56) References Cited

U.S. PATENT DOCUMENTS

| 5,910,706 | A | * | 6/1999 | Stevens | ................ | H05B 33/24 |
| | | | | | | 313/506 |
| 8,389,981 | B2 | | 3/2013 | Jun et al. | | |
| 8,878,167 | B2 | | 11/2014 | Jun et al. | | |
| 9,269,754 | B2 | | 2/2016 | Lee et al. | | |
| 2011/0049493 | A1 | | 3/2011 | Jun et al. | | |
| 2013/0087774 | A1 | | 4/2013 | Jun et al. | | |
| 2014/0070182 | A1 | | 3/2014 | Choi et al. | | |
| 2014/0361253 | A1 | | 12/2014 | Choi et al. | | |

(Continued)

FOREIGN PATENT DOCUMENTS

| KR | 10-2011-0021260 A | 3/2011 |
| KR | 10-2012-0076940 A | 7/2012 |

(Continued)

OTHER PUBLICATIONS

European Patent Office, Extended European Search Report and Opinion, EP Patent Application No. 20192126.9, dated Jan. 19, 2021, 11 pages.

*Primary Examiner* — Nduka E Ojeh
(74) *Attorney, Agent, or Firm* — Fenwick & West LLP

(57) ABSTRACT

An organic light emitting display device includes: light emitting diodes respectively located in first to third sub-pixels on a substrate and respectively emitting red, green and blue color lights output upward through emission regions of the first to third sub-pixels; and a reflection structure located in a non-emission region surrounded by the first to third sub-pixels and including reflection side surfaces which are inclined and respectively face the emission regions of the first to third sub-pixels, wherein the reflection side surface reflects a light incident thereon from the corresponding emission region upward.

16 Claims, 10 Drawing Sheets

(56) References Cited

U.S. PATENT DOCUMENTS

| | | |
|---|---|---|
| 2015/0295014 A1 | 10/2015 | Lee et al. |
| 2016/0155983 A1* | 6/2016 | Lee .................... H01L 51/5281 257/40 |
| 2018/0011385 A1* | 1/2018 | Kang ...................... G02F 1/157 |
| 2019/0067394 A1* | 2/2019 | Cheon ................ H01L 27/3283 |
| 2019/0115404 A1* | 4/2019 | Moon ................ H01L 51/5012 |
| 2019/0131578 A1 | 5/2019 | Lee et al. |
| 2019/0181188 A1 | 6/2019 | Youn et al. |
| 2021/0217830 A1* | 7/2021 | Huangfu ............. H01L 27/3246 |

FOREIGN PATENT DOCUMENTS

| | | |
|---|---|---|
| KR | 10-2015-0118662 A | 10/2015 |
| KR | 10-2016-0081704 A | 7/2016 |
| KR | 10-2019-0069285 A | 6/2019 |

\* cited by examiner

ORGANIC LIGHT EMITTING DISPLAY DEVICE INCLUDING REFLECTION STRUCTURE

CROSS-REFERENCE TO RELATED APPLICATION

The present application claims the priority benefit of Republic of Korea Patent Application No. 10-2019-0105182 filed in the Republic of Korea on Aug. 27, 2019, which is hereby incorporated by reference in its entirety.

BACKGROUND

Field of Technology

The present disclosure relates to an organic light emitting display device.

Discussion of the Related Art

Recently, flat display devices having excellent properties of a thin profile, light weight, low power consumption and the like have been developed widely and applied to various fields.

Among the flat display devices, an organic light emitting display device may be referred to as an organic electroluminescent display device and is a device in which charges are injected into an emitting layer formed between a cathode, which is an electron-injecting electrode, and an anode, which is a hole-injecting electrode, to form an electron-hole pair, and a light is emitted when the electron-hole pair disappears.

In case of a display device, such as a virtual reality display device, having a short viewing distance, a high resolution is required in order for a viewer not to recognize a lattice of the display device.

However, because of limitations of manufacturing processes, it is difficult to realize an organic light emitting display device having a high resolution. Thus, a solution to resolve a lattice recognition of an organic light emitting display device is needed.

SUMMARY

Accordingly, the present disclosure is directed to an organic light emitting display device that substantially obviates one or more of the problems due to limitations and disadvantages of the related art.

An object of the present disclosure is to provide an organic light emitting display device that can effectively reduce a lattice recognition thereof.

Additional features and advantages of the disclosure will be set forth in the description which follows, and in part will be apparent from the description, or may be learned by practice of the disclosure. The advantages of the disclosure will be realized and attained by the structure particularly pointed out in the written description and claims as well as the appended drawings.

To achieve these and other advantages, and in accordance with the purpose of the present disclosure, as embodied and broadly described herein, an organic light emitting display device includes: light emitting diodes respectively located in first to third sub-pixels on a substrate and respectively emitting red, green and blue color lights output upward through emission regions of the first to third sub-pixels; and a reflection structure located in a non-emission region surrounded by the first to third sub-pixels and including reflection side surfaces which are inclined and respectively face the emission regions of the first to third sub-pixels, wherein the reflection side surface reflects a light incident thereon from the corresponding emission region upward.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the disclosure and are incorporated in and constitute a part of this specification, illustrate embodiments of the disclosure and together with the description serve to explain the principles of the disclosure. In the drawings.

DETAILED DESCRIPTION

Reference will now be made in detail to embodiments, examples of which are illustrated in the accompanying drawings. The same or like reference numbers may be used throughout the drawings to refer to the same or like parts.

Figure 1:
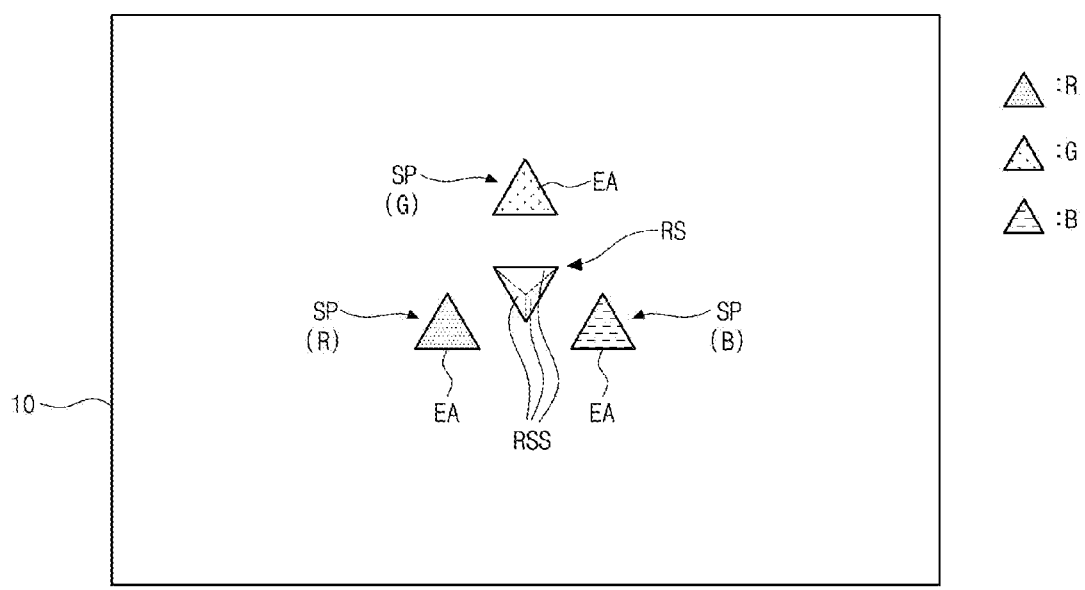
FIG. 1 is a plan view schematically illustrating a planar structure of an organic light emitting display device according to one embodiment of the present disclosure.

FIG. 1 is a plan view schematically illustrating a planar structure of an organic light emitting display device according to the present disclosure.

Referring to FIG. 1, the organic light emitting display device 10 of the present disclosure may include a reflection structure RS which is located in a non-emission region surrounded by a plurality of sub-pixels SP adjacent to the reflection structure RS and includes reflection side surfaces RSS facing emission regions EA of the sub-pixels SP.

The sub-pixels SP arranged to surround the reflection structure RS may include three or more sub-pixels SP displaying different colors. For example, the sub-pixels SP may include at least one sub-pixel SP emitting a red (R) color, at least one sub-pixel SP emitting a blue (B) color, and at least one sub-pixel SP emitting a green (G) color. In FIG. 1, for the purpose of explanations, a configuration that one red (R) sub-pixel SP, one blue (B) sub-pixel SP and one blue (B) sub-pixel SP are arranged to surround the reflection structure RS is shown by way of example.

By using the reflection structure RS, lights incident on the reflection side surfaces RSS are reflected and output upward, and an area of light output of the sub-pixels SP may substantially expand planarly. Accordingly, there is an effect as if a distance between the same color sub-pixels SP were reduced, and thus a lattice recognition can be reduced.

Further, because of the expansion of light output area of the sub-pixels SP, when the organic light emitting display device is applied to a virtual reality display device, an immersion of virtual reality can be improved.

Further, the non-emission region where the reflection structure RS is located serves as a light output region and acts as a display element like the sub-pixel SP. Thus, there is an effect of a resolution increase.

Embodiments of the organic light emitting display device with the reflection structure RS are explained below in detail.

First Embodiment

Figure 2:
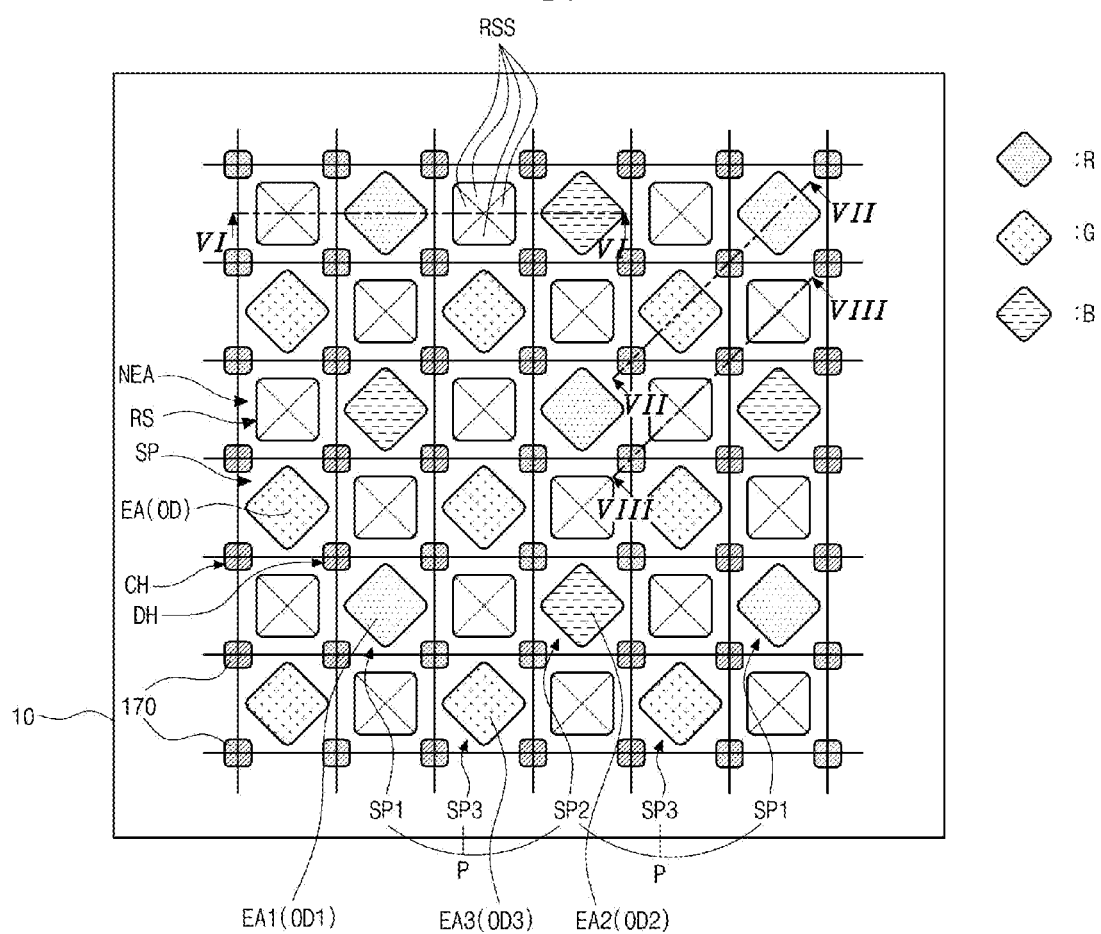
FIG. 2 is a plan view schematically illustrating a planar structure of an organic light emitting display device according to a first embodiment of the present disclosure.

FIG. 2 is a plan view schematically illustrating a planar structure of an organic light emitting display device according to a first embodiment of the present disclosure.

Referring to FIG. 2, the organic light emitting display device 10 of this embodiment may be a top emission type display device which emits a light in an upward direction from a substrate to display an image. In the organic light emitting display device 10, a plurality of sub-pixels SP may be arranged in a display region to display an image.

For the purpose of explanations, a horizontal direction in a plane of FIG. 2 may be referred to as a row direction (or a first direction), and a vertical direction in a plane of FIG. 2 may be referred to as a column direction (or a second direction).

The plurality of sub-pixels SP may include three sub-pixels, first to third sub-pixels SP1 to SP3 emitting different colors.

For example, the first, second and third sub-pixels SP1, SP2 and SP3 may display different colors among red (R), blue (B) and green (G) colors. In this embodiment, a case that the first, second and third sub-pixels SP1, SP2 and SP3 respectively display the red (R), blue (B) and green (G) colors is shown by way of example.

In each of the first to third sub-pixels SP1 to SP3, an emission region EA which emits and output its corresponding color to a display surface, which is located over the substrate, may be defined. Each sub-pixel may include a light emitting diode OD as a light emitting element which produces its corresponding color.

In this regard, in the first sub-pixel SP1, a first light emitting diode OD1 emitting a red (R) color may be formed and output the red (R) color. In the second sub-pixel SP2, a second light emitting diode OD2 emitting a blue (B) color may be formed and output the blue (B) color. In the third sub-pixel SP3, a third light emitting diode OD3 emitting a green (G) color may be formed and output the green (G) color.

The emission region EA in each sub-pixel EA may be defined by an opening which is formed in a bank corresponding to each sub-pixel SP. In this regard, the bank located between the sub-pixels SP (or between the emission regions EA) may include the opening which exposes a first electrode as a lower electrode of the light emitting diode OD of each sub-pixel SP, an organic light emitting layer may be located in the opening, and a region of the opening may be defined as the emission region EA of the sub-pixel SP.

The emission region EA of the sub-pixel SP may be various in plan shape. For example, as shown in FIG. 2, the emission region EA may have, but not limited to, a diamond shape. Alternatively, the emission region EA may have a circular shape or other quadrangular shape. When the emission region EA has the diamond shape, a uniform distance to the reflection structures RS arranged adjacent thereto may be effectively secured.

In this embodiment, the first to third sub-pixels SP1 to SP3 may be arrayed in a specific arrangement. For example, the first to third sub-pixels SP1 to SP3 may have a diamond pentile arrangement.

Regarding the diamond pentile arrangement, four sub-pixels SP adjacent to each other, for example, the first sub-pixel SP1 of the red (R) color, the second sub-pixel SP2 of the blue (B) color and the two third sub-pixels SP3 of the green (G) color may form an arrangement unit of a diamond shape, as shown in FIG. 2. Alternatively, in consideration of lifetime, the two second sub-pixels SP2 of the blue (B) color may be used in the arrangement. Alternatively, one of the two third sub-pixels SP3 may be replaced with a sub-pixel of a white color.

The emission regions EA of the different-colored sub-pixels SP1 to SP3 may be identical or different in area. The emission regions EA being different in area means that the emission regions EA of the first to third sub-pixels SP1 to SP3 are different in area from each other, or the emission region EA of one of the first to third sub-pixels SP1 to SP3 is different in area from the emission regions EA of the other two of the first to third sub-pixels SP1 to SP3.

In this embodiment, for the purpose of explanations, the emission regions EA of the first to third sub-pixels SP1 to SP3 having the same area is shown by way of example. Meanwhile, regarding the emission regions EA of the first to third sub-pixels SP1 to SP3 having different areas, for example, a first emission region EA1 of the red (R) color and a second emission region EA2 of the blue (B) color may have the same area or different areas, and areas of the first and second emission regions EA1 and EA2 may be greater than that of a third emission region EA3 of the green (G) color.

In this embodiment, by using the reflection structure RS, a light output region, in which each color is output and is viewed, expands. Accordingly, an area relation of light output regions of different colors may be made in accordance with the above-described area relation of the different-colored emission regions. In other words, the light output regions of different colors may be identical or different in area.

Regarding the arrangement of the sub-pixels SP, in one of an odd row line and an even row line as two neighboring row lines, for example, in an odd row line, the first and second sub-pixels SP1 and SP2 may be arranged alternately, and in an even row line, the third sub-pixel SP3 may be arranged. Further, the third sub-pixel SP3 may be located in a diagonal direction to the first and second sub-pixels SP1 and SP2. In other words, in two neighboring row lines, the first and second sub-pixels SP1 and SP2 and the third sub-pixel SP3 may be arranged in a zigzag form along a row direction.

Further, in one of an odd column line and an even column line as two neighboring column line, the first and second sub-pixels may be arranged alternately, and in the other of an odd column line and an even column line, the third sub-pixel SP3 may be arranged. In other words, in two neighboring column lines, the first and second sub-pixels SP1 and SP2 and the third sub-pixel SP3 may be arranged in a zigzag form along a column direction.

As the sub-pixels SP may be arranged above, the diamond-shaped arrangement unit, in which the first and second sub-pixels SP1 and SP2 are located at opposite sides and face each other and the two third sub-pixels SP3 are located at opposite sides and face each other, may be defined. Further, the diamond-shaped arrangement unit may be arrayed repeatedly in plane. For example, the neighboring arrangement units may be arrayed to share one side therebetween. In this regard, the arrangement unit may be arrayed diagonally such that two arrangement units neighboring diagonally to each other share two sub-pixels SP at one side therebetween.

In the above-described diamond pentile arrangement, the third sub-pixel SP3 of the green (G) color and the first and second sub-pixels SP1 and SP2 of the red (R) and blue (G) colors located diagonally to the third-sub pixel SP3 may form a pixel P which is an unit to display a color image, and the neighboring pixels P may share the first or second sub-pixel SP1 or SP2 therebetween to display an image. For example, as shown in FIG. 2, the third sub-pixel SP3, and the first and second sub-pixels SP1 and SP2, which are located in a row line neighboring to a row line of the third sub-pixel SP3 and are diagonal to the third-sub pixel SP3, may form the pixel P, and each pixel P may share its adjacent pixels P at its both sides in a row direction. This may mean that each pixel SP is constituted by one third sub-pixel SP3, a half of the first sub-pixel SP1 and a half of the second sub-pixel SP2.

As described above, in the diamond pentile arrangement, a number of the third sub-pixels SP3 may be two times of a number of the first sub pixels SP1 and a number of the second sub-pixels SP2.

In the above diamond pentile arrangement, as an inside region of the diamond-shaped arrangement unit, a non-emission region NEA which is surrounded by four sub-pixels SP forming the diamond-shaped arrangement unit and has no light emission element may be defined.

In other words, each non-emission region NEA may be configured to be surrounded by two sub-pixels SP adjacent at its both sides in its row line and two sub-pixels SP adjacent at its both sides in its column line.

For example, the non-emission region NEA in a row line where the third sub-pixel SP3 is located may be surrounded by two third sub-pixels SP3 adjacent at its both sides in its row line and by first and second sub-pixels SP1 and SP2 adjacent at its both sides in its column line.

Further, the non-emission region NEA in a row line where the first and second sub-pixels SP1 and SP2 are located may be surrounded by the first and second sub-pixels SP1 and SP2 adjacent at its both sides in its row line and by two third sub-pixels SP3 adjacent at its both sides in its column line.

In the non-emission region NEA defined by its adjacent sub-pixels SP, the reflection structure RS may be configured.

The reflection structure RS may include the reflection side surfaces RSS respectively corresponding to the sub-pixels SP surrounding the reflection structure RS. In other words, in the reflection structure RS, the reflection side surfaces RSS may be arranged to respectively face four sub-pixels SP (i.e., the emission regions EA of the four sub-pixels SP).

In order to increase a reflection efficiency, in a plan view, each reflection side surface RSS may be configured to face the emission region EA of its corresponding sub-pixel SP straight ahead.

Further, the reflection side surface RSS may be configured to be inclined. In this regard, the reflection side surface RSS may be configured as an inclined surface that is slanted toward an inside of the reflection structure RS along an upper direction.

By forming the reflection side surface RSS to be inclined, a light output laterally from the corresponding sub-pixel SP may be reflected on the inclined reflection side surface RSS and then be output straight upward to a front of the display device.

The reflection side surface RSS may be configured to have a flat surface shape which is entirely flat, or a concave surface shape which is concave toward an inside of the reflection structure RS. In the case of the concave surface shape, the reflection side surface RSS may function as a concave mirror, and a reflection efficiency may be improved. The flat surface shape or concave surface shape of the reflection side surface RSS may be explained in detail below.

As such, the reflection side surface RSS may serve like a light output portion which outputs a light produced from the corresponding sub-pixel SP to a display surface.

In this regard, for example, a light, which is emitted laterally from each of the first and second sub-pixels SP1 and SP2 located at opposite sides with respect to the reflection structure RS, enters and is reflected on the reflection side surface RSS corresponding to each of the first and second sub-pixels SP1 and SP2, and then is output upward. Similarly, a light, which is emitted laterally from each of the two third sub-pixels SP3 located at opposite sides with respect to the reflection structure RS, enters and is reflected on the reflection side surface RSS corresponding to each of the two third sub-pixels SP1 and SP2, and then is output upward.

Because of such the reflection and output of light, an effect that a light output area of the sub-pixels SP expands planarly may be realized.

In other words, since a region of each reflection side surface RSS of the reflection structure RS may serve to output a light upward to a display surface like an emission region of the sub-pixel SP, the non-emission region NEA where the reflection structure RS is located may be seen as emission regions of the sub-pixels SP. Thus, an effect that an output area of a light from the sub-pixel SP expands to the non-emission region NEA of the reflection structure RS may be achieved.

Accordingly, there may be an effect as if a distance between the same color sub-pixels SP were reduced, and thus a lattice recognition may be reduced.

Figure 3:
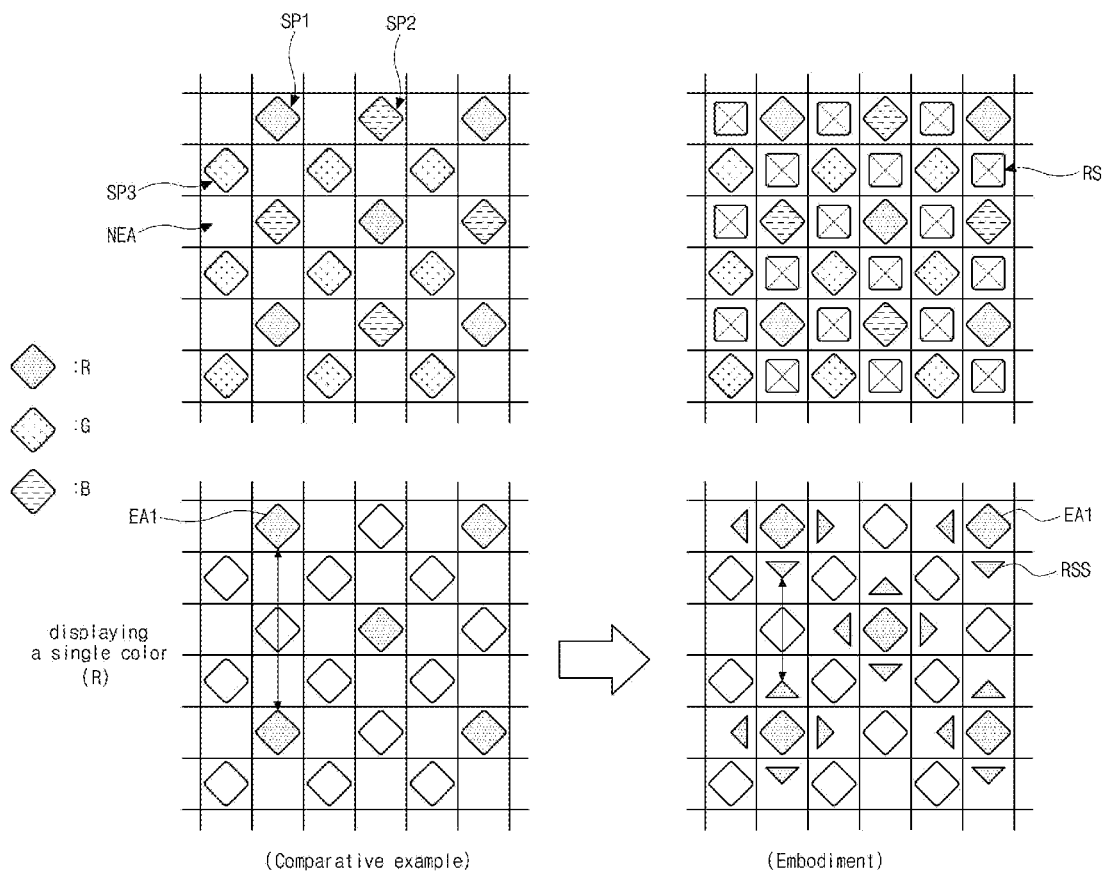
FIG. 3 is a view schematically illustrating regions displaying a red color when each of an organic light emitting display device of a comparative example and an organic light emitting display device of the first embodiment is operated to display a single color of a red color.

This may further refer to FIG. 3. FIG. 3 is a view schematically illustrating regions displaying a red color when each of an organic light emitting display device of a comparative example and the organic light emitting display device of the first embodiment is operated to display a single color e.g., a red color.

In the organic light emitting display device of the comparative example, a reflection structure is not formed at a non-emission region NEA which is surrounded by first, second and third sub-pixels SP1, SP2 and SP3 arranged in a diamond shape.

When the organic light emitting display device of the comparative example is operated to display a single color of a red color, a red color light is output only at an emission region EA1 of a red-color sub-pixel SP1.

In the comparative example, a distance between the neighboring regions displaying the same color is as much as recognized by a viewer, and thus a lattice recognition occurs.

When the organic light emitting display device of this embodiment is operated to display a single color of a red color, a red color light is output at the emission region EA1 of the red-color first sub-pixel SP1 and is further output from the reflection side surface RSS of the reflection structure RS which is located at the non-emission region NEA adjacent to the emission region EA1.

As such, in this embodiment, an output region of a red color light includes the emission region EA1 of the first sub-pixel SP1 of a red color and can expand to a corresponding reflection region (i.e., a region of the corresponding reflection side surface RSS of the reflection structure RS) of the non-emission region NEA located in a lateral direction from the first sub-pixel SP1.

Compared with the comparative example, a distance between the neighboring regions displaying the same color can be reduced. Thus, a lattice recognition can be reduced by 1.5 times.

Accordingly, a lattice recognition which a viewer recognizes can be reduced significantly.

Further, by expansion of the light output region of the sub-pixel SP, when the organic light emitting display device is used as a virtual reality display device, an immersion of virtual reality can be improved.

Further, the non-emission region of the reflection structure RS serves as a light output region and acts as a display element like the sub-pixel SP. Thus, there is an effect of an increase of light transmittance and an increase of resolution as well.

Figure 4:
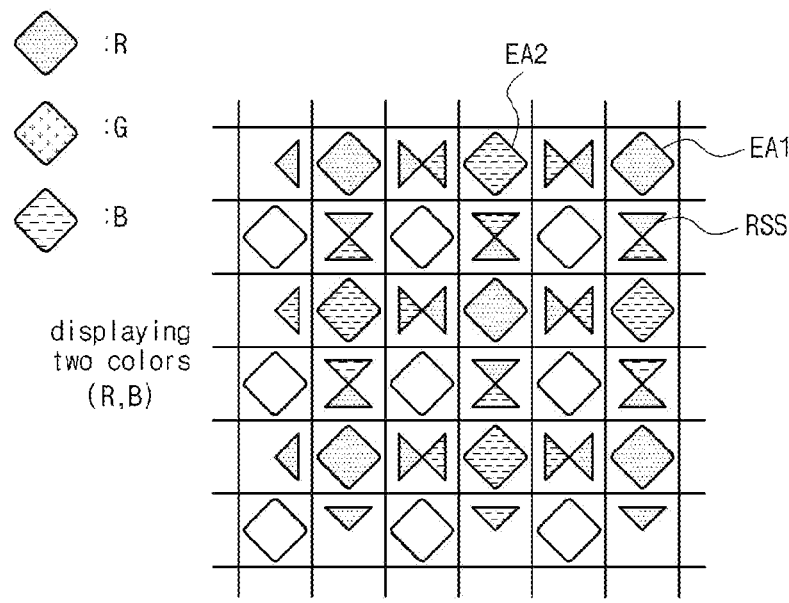
FIG. 4 is a view schematically illustrating an organic light emitting display device being operated to display two colors according to the first embodiment of the present disclosure.
Figure 5:
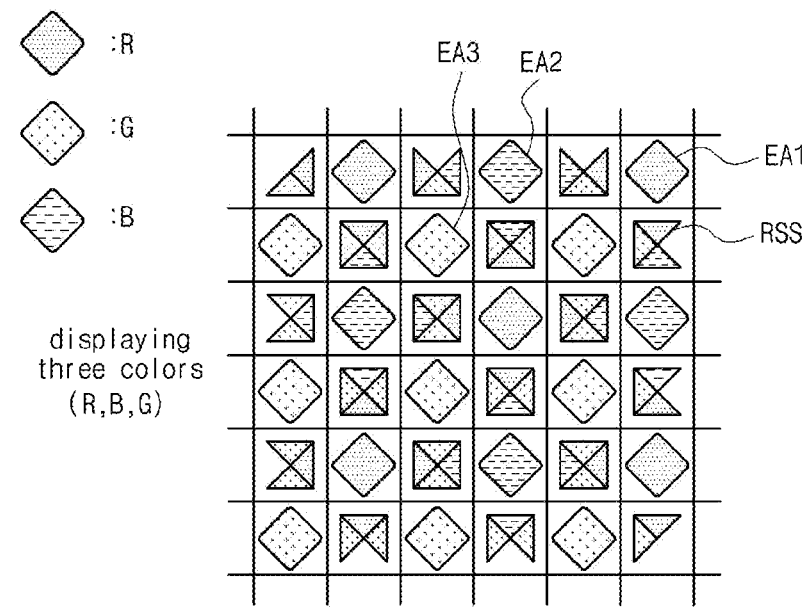
FIG. 5 is a view schematically illustrating an organic light emitting display device being operated to display three colors according to the first embodiment of the present disclosure.

FIG. 4 is a view schematically illustrating the organic light emitting display device being operated to display two colors according to the first embodiment of the present disclosure. FIG. 5 is a view schematically illustrating the organic light emitting display device being operated to display three colors according to the first embodiment of the present disclosure.

In FIG. 4, an operation to display two colors, for example, red color and blue color is shown by way of example. In this case, the emission region EA1 of the first sub-pixel SP1 outputs a red color light, and the emission region EA2 of the second sub-pixel SP outputs a blue color light. In addition, a red color light and a blue color light are output through the respective reflection side surfaces RSS of the reflection structure RS which are located at the non-emission region NEA adjacent to the first and second sub-pixels SP1 and SP2 and correspond to the first and second sub-pixels SP1 and SP2, respectively. As such, in the case of the operation to displaying two colors, a color light which is a mixed (or combined) color light of the emitted two color lights is output and seen.

In FIG. 5, an operation to display three colors, for example, red color, blue color and a green color is shown by way of example. In this case, the emission regions EA1, EA2 and EA3 of the first to third sub-pixels SP1 to SP3 output a red color light, a blue color light and a green color light. In addition, a red color light, a blue light and a green color light are output through the respective reflection side surfaces RSS of the reflection structure RS which are located at the non-emission region NEA adjacent to the first to third sub-pixels SP1 to SP3 and correspond to the first to third sub-pixels SP1 to SP3, respectively. As such, in the case of the operation to displaying three colors, a color light which is a mixed (or combined) color light of the emitted three color lights is output and seen.

As in the light emission operations of FIGS. 3 to 5, a color of a light through the reflection structure RS may change in accordance to a combination of emission states of the first to third sub-pixels SP1 to SP3 surrounding the reflection structure RS.

Referring back to FIG. 2, in each sub-pixel SP, an electrode contact hole CH may be formed at a peripheral region outside the emission region EA. Through the electrode contact hole CH, a first electrode of the light emitting diode OD of each sub-pixel SP may be electrically connected to a driving element (e.g., a driving transistor) of each sub-pixel SP.

The electrode contact holes CH of the sub-pixels SP may be formed in the same direction and at the same position. For example, as shown in FIG. 2, each electrode contact hole CH may be located at a corner portion on a left and lower side of each emission region EA.

In each non-emission region NEA surrounded by the corresponding sub-pixels SP, a dummy hole DH may be formed and have position and structure corresponding to the electrode contact hole CH. Since the non-emission region NEA has the reflection structure RS as a non-emission element, the dummy hole DH may not require a connection structure of the driving element and the light emitting diode OD in the electrode contact hole CH and may not have the connection structure.

In the display device, a number of the electrode contact holes CH may be equal to a number of the dummy holes DH.

Figure 7:
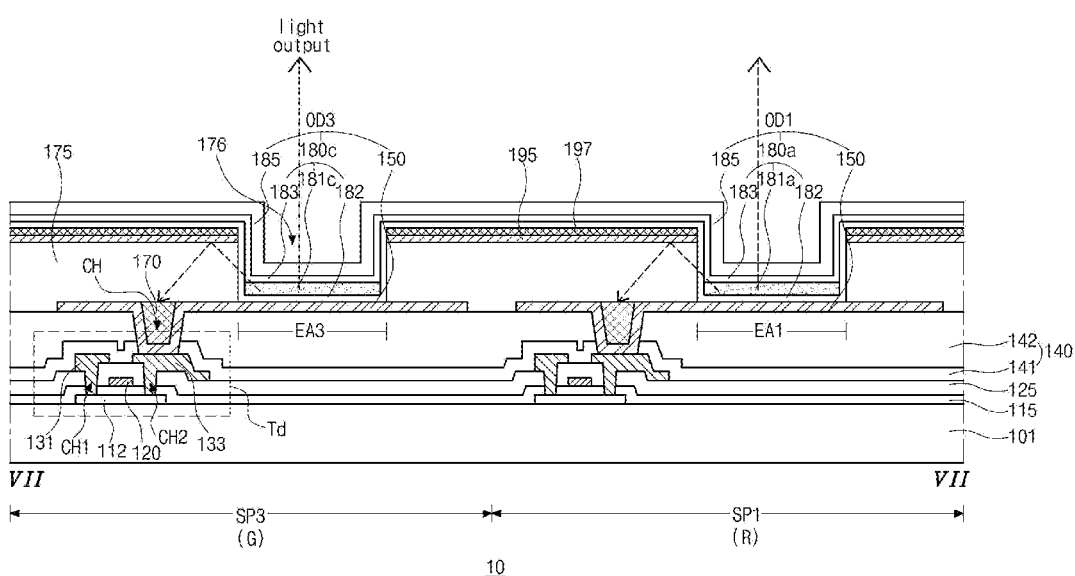
FIG. 7 is a cross-sectional view taken along a line VII-VII of FIG. 2 according to one embodiment.
Figure 8:
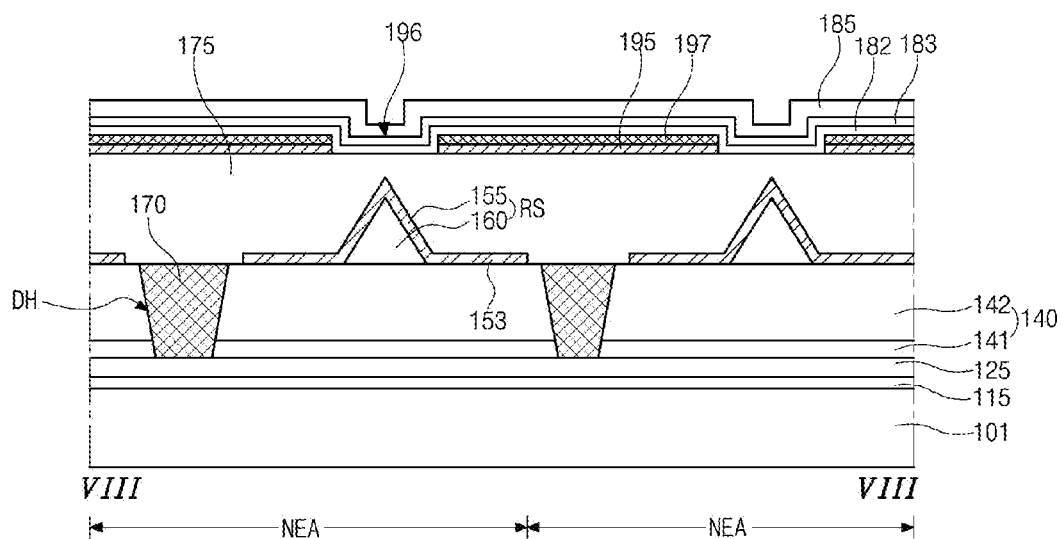
FIG. 8 is a cross-sectional view taken along a line VIII-VIII of FIG. 2 according to one embodiment.

A structure of the sub-pixel SP and a structure of the non-emission region NEA having the reflection structure RS are explained in detail below further with reference to FIGS. 6 to 8.

Figure 6:
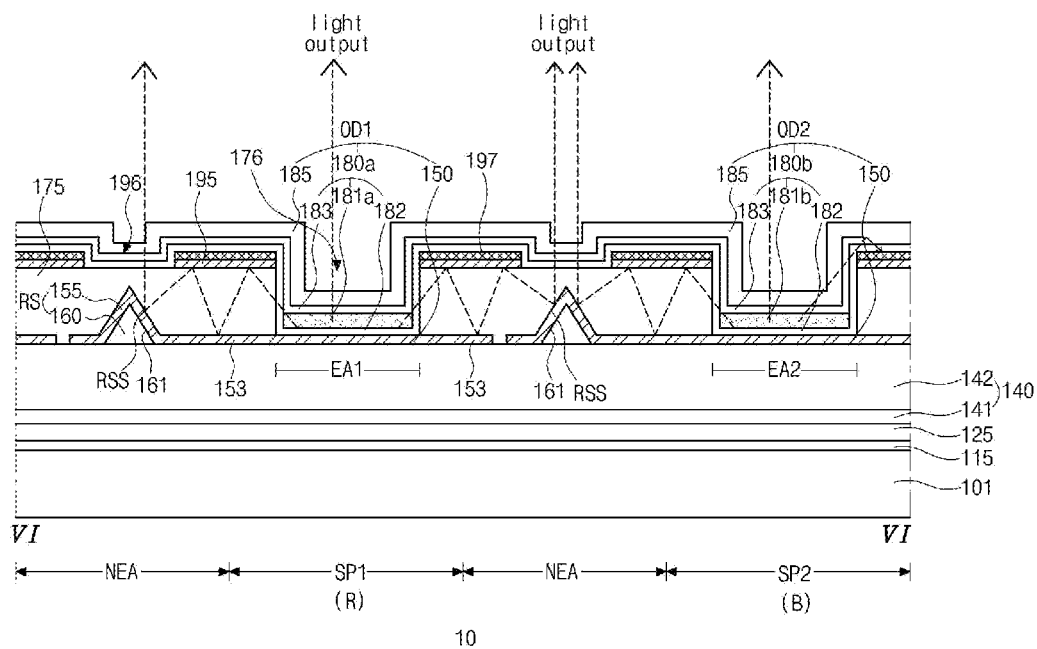
FIG. 6 is a cross-sectional view taken along a line VI-VI of FIG. 2 according to one embodiment.

FIG. 6 is a cross-sectional view taken along a line VI-VI of FIG. 2. FIG. 7 is a cross-sectional view taken along a line VII-VII of FIG. 2. FIG. 8 is a cross-sectional view taken along a line VIII-VIII of FIG. 2 according to one embodiment.

Referring to FIGS. 2 and 6 to 8, in the organic light emitting display device 10 of this embodiment, the light emitting diode OD and driving elements to drive the light emitting diode OD may be formed in each sub-pixel SP on a substrate 101. The driving elements, for example, a plurality of transistors including a driving transistor Td and a switching transistor (not shown) electrically connected to the driving transistor Td may be used. The plurality of transistors may be configured with an N type transistor and/or an P type transistor.

The light emitting diode OD may be connected to one of the plurality of transistors in the sub-pixel SP, and, in this embodiment, the light emitting diode OD being connected to the driving transistor Td is shown by way of example. The light emitting diode OD may be connected to a drain electrode 133 or source electrode 131 of the driving transistor Td, and, in this embodiment, the light emitting diode OD being connected to the drain electrode 133 is shown by way of example.

On the substrate 101, the reflection structure RS may be formed at the non-emission region NEA surrounded by the sub-pixels SP arranged in the diamond shape.

In detail, a semiconductor layer 112 may be formed on an inner surface of the substrate 101. The semiconductor layer 112 may be made of, but not limited to, a polycrystalline silicon or oxide semiconductor material.

A gate insulating layer 115 as an insulating layer may be formed on the semiconductor layer 112. The gate insulating layer 115 may be formed of an inorganic insulating material, for example, silicon oxide ($SiO_2$) or silicon nitride (SiNx).

A gate electrode 120 made of a conductive material, such as a metal, may be formed on the gate insulating layer 115 corresponding to a center of the semiconductor layer 112.

Further, a gate line connected to a gate electrode of the switching transistor may be formed on the gate insulating layer 115.

An interlayer insulating layer 125 as an insulating layer may be formed on the gate electrode 120. The interlayer insulating layer 125 may be formed entirely over the substrate 101.

The interlayer insulating layer 125 may be formed of an inorganic insulating material, such as silicon oxide ($SiO_2$) or silicon nitride (SiNx), or an organic insulating material, such as benzocyclobutene (BCB) or photo acryl.

The interlayer insulating layer 125 may have a first contact hole CH1 and a second contact hole CH2 respectively exposing both side portions of the semiconductor layer 112.

The first contact hole CH1 and the second contact hole CH2 may be located at both sides of the gate electrode 120 and be spaced apart from the gate electrode 120. Further, the first contact hole CH1 and the second contact hole CH2 may be formed in the gate insulating layer 115.

The source and drain electrodes 131 and 133 made of a conductive material, such as a metal, may be formed on the interlayer insulating layer 125

Further, a data line crossing the gate line and connected to a source electrode of the switching transistor may be formed on the interlayer insulating layer 125.

The source and drain electrodes 131 and 133 may be spaced apart from each other with the gate electrode 120 therebetween, and may contact both side portions of the semiconductor layer 112 through the first and second contact holes CH1 and CH2, respectively.

The semiconductor layer 112, the gate electrode 120 and the source and drain electrodes 131 and 133 may form the driving transistor Td.

Alternatively, the driving transistor Td may have an inverted staggered structure in which a gate electrode is located below a semiconductor layer, and source and drain electrodes is located on the semiconductor layer.

A passivation layer 140 as an insulating layer may be formed on the source and drain electrodes 131 and 133. The passivation layer 140 may be formed entirely over the substrate 101.

The passivation layer 140 may have a single-layered or multi-layered structure.

In the case of the single-layered structure, the passivation layer 140 may be formed using an inorganic insulating material or organic insulating material. In the case of the multi-layered structure, the passivation layer 140 may be formed using at least one of an inorganic insulating material or organic insulating material.

The inorganic material for the passivation layer 140 may be silicon oxide ($SiO_2$) or silicon nitride (SiNx). The organic material for the passivation layer 140 may be benzocyclobutene (BCB) or photo acryl.

In this embodiment, the passivation layer 140 having double-layered structure is shown by way of example. In this case, the passivation layer 140 may include a first passivation layer 141 made of an inorganic insulating material, and a second passivation layer 142 which is located on the first passivation layer 141, is made of an organic insulating material and have a flat top surface.

The passivation layer 140 may include the electrode contact hole (or drain contact hole) CH formed in each sub-pixel SP.

In the non-emission region NEA, the passivation layer 140 may include the dummy hole DH. The dummy hole DH may be formed in the process of forming the electrode contact hole CH. A position of the dummy hole DH in the non-emission region NEA may be set to be substantially equal to a position of the electrode contact hole CH in the sub-pixel SP.

In this regard, the electrode contact hole CH may be located within the emission region EA in each sub-pixel SP, or at the peripheral region around the emission region EA in each sub-pixel SP. When considering a reduction of light leakage, the electrode contact hole CH is preferably located at the peripheral region around the emission region EA in each sub-pixel SP.

For example, referring to FIG. 2, in a plan view, the electrode contact hole CH may be located at a portion on a left and lower side in the sub-pixel SP, and in more detail, may be located at a corner portion on a left and lower side in the sub-pixel SP. The dummy hole DH may be located, at a position corresponding to the position of the electrode contact hole CH, in the non-emission region NEA.

Since the non-emission region NEA has the reflection structure RS as a non-emission element, a connection structure of the driving transistor Td and the light emitting diode OD in the electrode contact hole CH may not be formed in the dummy hole DH.

A first electrode 150 may be formed on the passivation layer 140 in each sub-pixel SP. The reflection structure RS may be formed on the passivation layer 140 in the non-emission region NEA.

The first electrode 150 as a lower electrode of the light emitting diode OD may be formed to have a patterned shape in each sub-pixel SP. The first electrode 150 may be connected to the drain electrode 133 of the driving transistor Td through the electrode contact hole CH.

The first electrode 150 may include a metal having a reflective property and serve as a reflective electrode. Thus, a light emitted from an organic light emitting layer is reflected on the first electrode 150 and then output upward to a display surface. The metal of the first electrode 150 may be, but not limited to, Ag, Ti, APC (Al—Pd—Cu) alloy or the like.

The first electrode 150 may have a single-layered structure having a reflective layer made of a metal having a reflective property, or have a multi-layered structure having a transparent layer which is made of a transparent conductive material, such as ITO, IZO or the like, and is located on the reflective layer.

In the non-emission region NEA, a protrusion pattern 160 functioning to define a shape the reflection structure RS may be formed. The protrusion pattern 160 may have a taper shape which protrudes upward and decreases in size (or width) along an upper direction.

Figure 9:
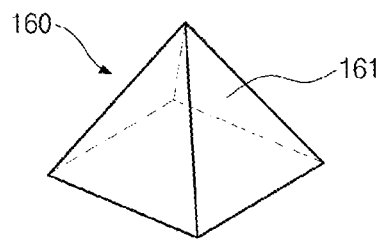
FIG. 9 is a view schematically illustrating a reflection structure having a quadrangular pyramid shape according to the first embodiment of the present disclosure.
Figure 10:
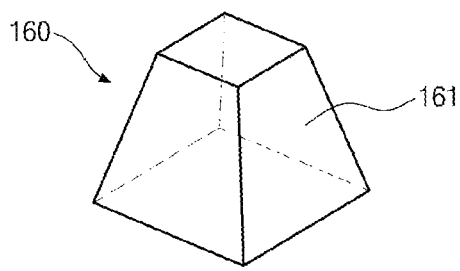
FIG. 10 is a view schematically illustrating a reflection structure having a truncated quadrangular pyramid shape according to the first embodiment of the present disclosure.

The protrusion pattern 160 may be a structure which includes inclined side surfaces 161 respectively corresponding to the sub-pixels SP surrounding the protrusion pattern 160. For example, the protrusion pattern 160 may have a polygonal pyramid shape with an apex at its top end or a truncated polygonal pyramid shape with a surface at its top end. For example, the polygonal pyramid shape may be a quadrangular pyramid shape, and the truncated polygonal pyramid shape may be a truncated quadrangular pyramid shape. The quadrangular pyramid shape may refer to FIG. 9, and the truncated quadrangular pyramid may refer to FIG. 10.

The reflective first electrode 150, which is formed at one of the four sub-pixels SP surrounding the taper-shaped protrusion pattern 160, may extend over the protrusion pattern 160. In this embodiment, the first electrode 150, which is formed on the sub-pixel SP at one side e.g., at a right side of the non-emission region NEA, may extend to cover the protrusion pattern 160 of this non-emission region NEA.

The first electrode 150 of each sub-pixel SP may include electrode extension portions 153 which extend from the emission region EA to four non-emission regions NEA adjacent to each sub-pixel SP.

The electrode extension portion 153 which extends to the non-emission region NEA at one side e.g., a left side of the sub-pixel SP may include a part covering the protrusion pattern 160 along a surface of the protrusion pattern 160, and this part of the electrode extension portion 153 may be referred to as a reflection part 155.

The protrusion pattern 160 and the reflection part 155, which is located on the protrusion pattern 160 and entirely covers the surface of the protrusion pattern 160, may form the reflection structure RS.

Since the reflection part 155 may cover the protrusion pattern 160, the reflection structure RS may include the reflection side surfaces RSS which each correspond to each of the sub-pixels SP surrounding the reflection structure RS. In other words, the side surfaces of the reflection part 155, which are on the inclined side surfaces 161 of the protrusion pattern 160, may serve as the reflection side surfaces RSS.

An inclined angle of the reflection side surface RSS with respect to a surface of the substrate 101 may be in a range of, for example, about 30 degrees to about 60 degrees in order to effectively achieve an upward reflection.

Figure 11:
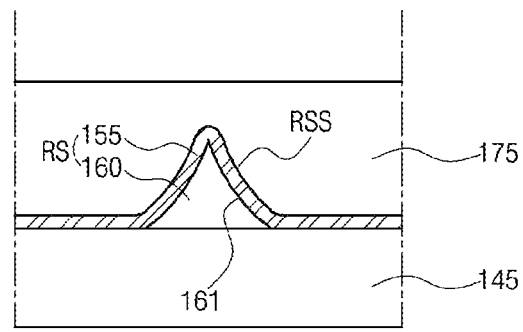
FIG. 11 is a view schematically illustrating a reflection structure having a concave reflection side surface according to the first embodiment of the present disclosure.

As shown in the drawings, the reflection side surface RSS may be flat. Alternatively, as shown in FIG. 11, the reflection side surface RSS may be concave.

The reflection part 155 of the reflection structure RS may be formed such that the reflection part 155 does not extend from the first electrode 150 of the sub-pixel SP but is patterned separately from the first electrode 150 and is spaced apart from the first electrode 150.

The electrode contact hole CH and the dummy hole DH may be covered with and be filled with a light-shielding pattern 170 having a light-shielding property.

The light shielding pattern 170 may be formed using a black light-shielding material, for example, a black resin.

When the light-shielding pattern 170 is formed at the electrode contact hole CH and the dummy hole DH, a light leakage that a color light of each sub-pixel SP enters its adjacent sub-pixels SP can be reduced, and an unwanted color mixing can be reduced.

In this regard, in the arrangement of this embodiment, the sub-pixels SP are arranged such that each sub-pixel SP is different in color from four sub-pixels SP located diagonally to each sub-pixel SP. In this case, two electrode contact holes CH and two dummy holes DH may be located in four directions diagonal to each sub-pixel SP, and the light shielding pattern 170 may be formed at each of the two electrode contact holes CH and the two dummy holes DH.

In other words, for each sub-pixel SP (or for each emission region EA), two electrode contact holes CH and two dummy holes DH may be located respectively at four separate regions between four reflection structures RS surrounding each sub-pixel SP.

Accordingly, a color light of each sub-pixel SP can be reduced from entering its adjacent sub-pixels SP by the light-shielding patterns 170 located diagonally to each sub-pixel SP.

As described above, since the electrode contact hole CH and the dummy hole DH having a structure corresponding to the electrode contact hole CH are formed, a light leakage from each sub-pixel SP to its adjacent sub-pixels SP can be reduced effectively.

Further, the electrode extension portion 153 located in the non-emission region NEA having the dummy hole DH may be not formed in the dummy hole DH. Alternatively, similarly to the electrode contact hole CH, the electrode extension portion 153 may be formed in the dummy hole DH. In this embodiment, the electrode extension portion 153 being not formed in the dummy hole DH is shown by way of example.

On the substrate 101 having the reflection structure RS, the first electrode 150 and the shielding pattern 170, a bank 175 defining the emission region EA of each sub-pixel SP may be formed.

The bank 175 may be formed at an edge (or boundary) of each sub-pixel SP and serve as a separation wall to separate (or divide) the sub-pixels SP (or the emission regions EA) from each other. The bank 175 may include an opening 176 exposing a portion of the first electrode 150 of each sub-pixel SP.

A substantial light emission through the organic light emitting layer may be produced at the portion of the first electrode 150 exposed through the opening 176. Thus, a region of the exposed portion of the first electrode may be substantially defined as the emission region EA.

The bank 175 may be formed to cover an edge region other than the emission region EA in each sub-pixel SP. Further, the bank 175 may be formed to cover the non-emission region NEA surrounded by the sub-pixels SP. The edge region of each sub-pixel SP may be a region which does not emit a light and be considered as a non-emission region.

In this embodiment, the bank 175 of this embodiment may be formed of an inorganic insulating material and/or an organic insulating material having a transparent property so that a light travels from the sub-pixel SP to its adjacent non-emission region NEA.

At the opening 176 of each sub-pixel SP, the organic insulating layer emitting a color light of each sub-pixel SP may be formed on the exposed portion of first electrode 150. For example, first, second and third organic light emitting layers 180a, 180b and 180c emitting red (R), blue (B) and green (G) lights may be formed in the first, second and third sub-pixels SP1, SP2 and SP3, respectively.

The first, second and third organic light emitting layers 180a, 180b and 180c may include first, second and third emitting material layers 181a, 181b and 181c producing red (R), blue (B) and green (G) lights, respectively.

Each of the first, second and third emitting material layers 181a, 181b and 181c may be formed in the opening 176 of the corresponding sub-pixel SP using, for example, a fine metal mask (FMM) method. Alternatively, each emitting material layer may be formed using other method including a soluble process method.

Regarding the FMM method, for example, a first emitting material of a red color may be deposited using an FMM mask having an opening corresponding to the first sub-pixel SP1 to form the first emitting material layer 181a. In a similar manner, the second and third emitting material layers 181b and 181c may be formed at the second and third sub-pixels SP2 and SP3 using FMM masks, respectively.

When the emitting material layers 181a, 181b and 181c are formed through the FMM method, there may be a limit to a resolution due to a nature of the method and thus a lattice recognition may happen. Accordingly, the reflection structure RS may be effective for improving a performance of an organic light emitting display device manufactured using the FMM mask.

On the substrate 101 having the organic light emitting layers, a second electrode 185 as an upper electrode of the light emitting diode OD may be formed entirely. The second electrode 185 may be formed in the opening 176 and on the bank 175.

One of the first and second electrodes 150 and 185 may serve as an anode, and the other of the first and second electrodes 150 and 185 may serve as a cathode. In this embodiment, the first electrode 150 serving as an anode and the second electrode 185 serving as a cathode is described by way of example.

The organic light emitting layer of each sub-pixel SP may further include charge transfer layers, as organic material layers, which are located below and on the emitting material layer and improve transferring (e.g., injecting, transporting, and/or the like) holes and electrons from the first and second electrodes 150 and 185 to the emitting material layer. For example, a first charge transfer layer 182 may be formed below each emitting material layer to improve transferring holes, and a second charge transfer layer 183 may be formed on each emitting material layer to improve transferring electrons. The first charge transfer layer 182 may include, for example, a hole injection layer, a hole transporting layer and the like. The second charge transfer layer 183 may include, for example, an electron injection layer, an electron transporting layer and the like.

The first and second charge transfer layers 182 and 183 may be formed entirely over the substrate 101. In other words, the first and second charge transfer layers 182 and 183 may be formed in the opening 176 and on the bank 175. For the organic light emitting layer of each sub-pixel SP, an emission stack unit having the first and second charge transfer layers 182 and 183 and the emitting material layer therebetween, or a plurality of emission stack units laminated may be formed. In other words, the organic light emitting layer may be configured in a single-laminated emission stack structure or multi-laminated emission stack structure.

The second electrode 185 may be formed of a transparent conductive material, such as ITO, IZO, or the like, and have a transparent property. Thus, a light traveling upward through the emission region EA in each sub-pixel SP may pass through the second electrode 185 and output to the outside.

In this embodiment, in order that a light produced at the sub-pixel SP is effectively guided to the reflection structure RS located at a side of the sub-pixel SP, the reflection pattern 195 may be formed. The reflection pattern 195 may be a preferable component for an effect of improving a function to guide a light to the reflection structure RS. However, the reflection pattern 195 may not be necessary and may not be employed.

The reflection pattern 195 may be formed on a top surface of the bank 175 and be located below the second electrode 185 and the charge transfer layers 182 and 183.

The reflection pattern 195 and the electrode extension portion 153 each having a reflective property and facing each other may be located on and below the bank 175, respectively, to form a light guide structure along a lateral direction. Thus, a light emitted laterally from the sub-pixel SP may be effectively transferred to the reflection structure RS along the bank 175 through a light-guiding function by reflections of the reflection pattern 195 and the electrode extension portion 153.

A through hole 196 may be formed in the reflection pattern 195 over the reflection structure RS to output a reflected light. In consideration of effectively outputting a light via the through hole 196, an area of the through hole 196 may be equal to or greater than that of the reflection structure RS.

Accordingly, a light of the sub-pixel SP may be reflected on the corresponding reflection side surface RSS of the reflection structure RS then pass through the through hole 196 and then be output upward.

In this embodiment, a light-shielding layer 197 may be formed on the reflection pattern 195. The light-shielding layer 197 may be formed below the second electrode 185 and the charge transfer layers 182 and 183. The light-shielding layer 197 may be formed using a black light shielding material.

Accordingly, a light, which is emitted in a slanted direction from the emission region EA and travels laterally by a total reflection on the top surface of the second electrode 185 and a reflection on the reflection pattern 195, may be shielded. Thus, an unwanted color mixing can be reduced.

The light-shielding layer 197 may be formed to have the same shape in plane as the reflection pattern 195. The light-shielding layer 197 along with the reflection pattern 195 may have the through hole 196 corresponding to the reflection structure RS.

Even though not shown in the drawings, an encapsulation layer may be formed on the second electrode 185 to encapsulate the organic light emitting display device. The encapsulation layer may be formed entirely over the substrate 101.

The encapsulation layer may block a penetration of a moisture and/or an air from the outside, and improve a reliability.

Second Embodiment

Figure 12:
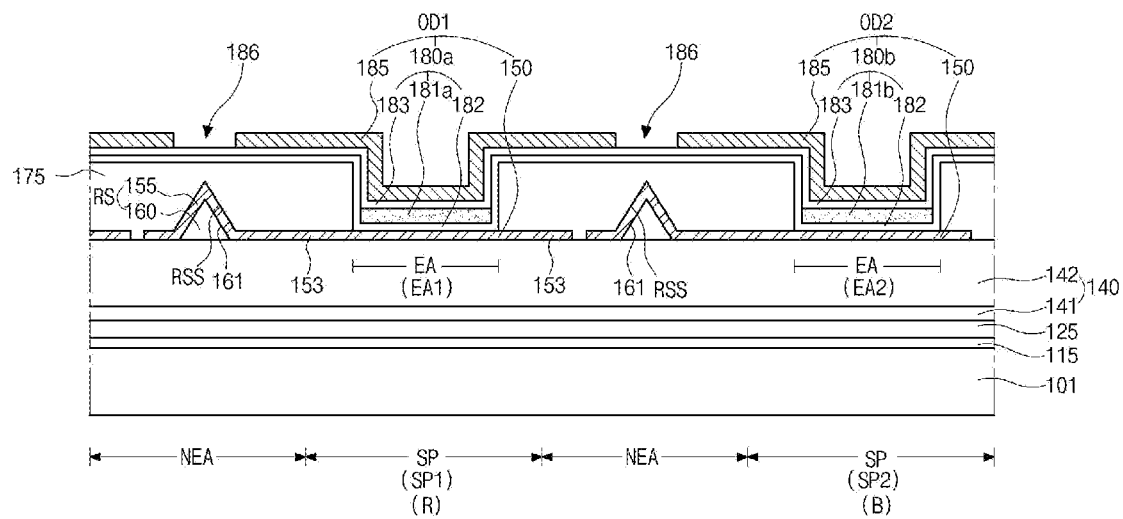
FIG. 12 is a cross-sectional view illustrating an organic light emitting display device according to a second embodiment of the present disclosure.

FIG. 12 is a cross-sectional view illustrating an organic light emitting display device according to a second embodiment of the present disclosure. FIG. 12 shows a portion corresponding to a portion shown in FIG. 6

Explanations of the same or like parts of the first embodiment may be omitted.

Referring to FIG. 12, the organic light emitting display device 10 of this embodiment may be a display device which can have a structure achieving a micro cavity effect i.e., have a micro cavity structure. The micro cavity structure can improve a color purity and a light output efficiency through a light constructive interference.

In the micro cavity structure, the second electrode 185 as the upper electrode of the light emitting diode OD may be formed to have a semi-transparent property.

In this case, in each sub-pixel SP, its color light reflected and constructively interfered between the first electrode 150 and the second electrode 185, which are located below and on the organic light emitting layer, may pass through the semi-transparent second electrode 185 and be output upward. Each sub-pixel SP may be set such that a distance between the first electrode 150 and the second electrode 185 i.e., a cavity thickness corresponds to a color wavelength of each sub-pixel SP.

The second electrode 185 may be formed of a metal, for example, Mg, Ag, or an alloy of Mg and Ag.

In the micro cavity structure, the second electrode 185 may have a semi-transparent property i.e., both a reflective property and a transparent property.

Accordingly, instead of the reflection pattern (195 of FIG. 6) as a component functioning to laterally guide a light in the first embodiment, the semi-transparent second electrode 185, which may be substantially formed over an entire surface of the substrate 101, may function to laterally guide a light.

In this regard, the semi-transparent second electrode 185 and the reflective electrode extension portion 153 facing each other may be located on and below the bank 175, respectively, to form a light guide structure along a lateral direction. Thus, a light emitted laterally from the sub-pixel SP may be sufficiently transferred to the reflection structure RS along the bank 175 through a light-guiding function by reflections of the second electrode 185 and the electrode extension portion 153.

A through hole 186 may be formed in the second electrode 185 over the reflection structure RS to output a reflected light. In consideration of effectively outputting a light via the through hole 186, an area of the through hole 186 may be equal to or greater than that of the reflection structure RS.

Accordingly, a light of the sub-pixel SP may be reflected on the corresponding reflection side surface RSS of the reflection structure RS then pass through the through hole 186 and then be output upward.

As described above, in this embodiment, without the reflection pattern of the first embodiment, there is an advantage that the semi-transparent second electrode 185 can be used as a component for a light guiding.

Third Embodiment

Figure 13:
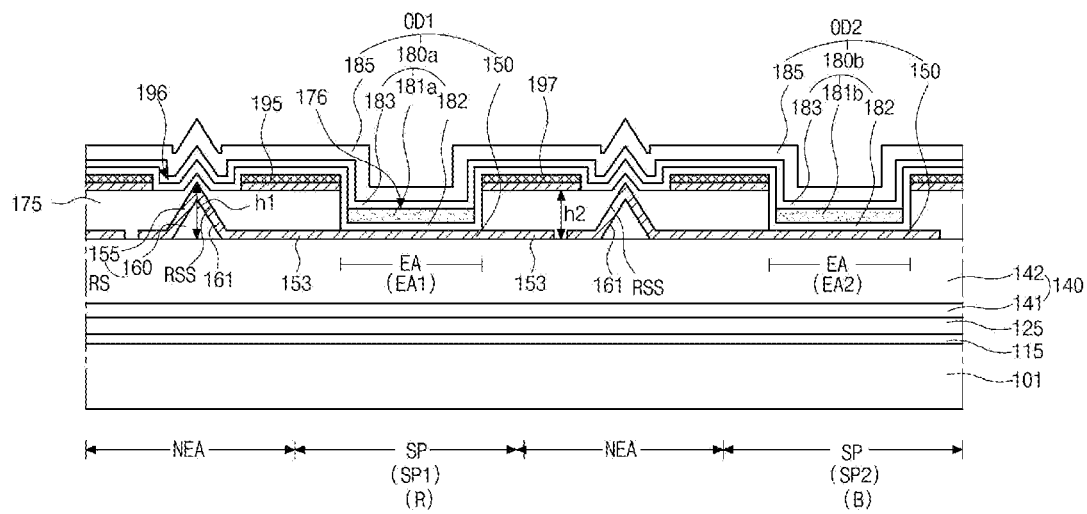
FIG. 13 is a cross-sectional view illustrating an organic light emitting display device according to a third embodiment of the present disclosure.

FIG. 13 is a cross-sectional view illustrating an organic light emitting display device according to a third embodiment of the present disclosure. FIG. 13 shows a portion corresponding to a portion shown in FIG. 6

Explanations of the same or like parts of the first and second embodiments may be omitted.

Referring to FIG. 13, in the organic light emitting display device 10 of this embodiment, a first height (or first thickness) h1 as a height (or thickness) of the reflection structure RS may be greater than a second height (or second thickness) h2 as a height (or thickness) of the bank 175.

In other words, the reflection structure RS may have a portion which protrudes upward from the top surface of the bank 175.

When the reflection structure RS is formed to be higher than the bank 175, a lateral leakage of light through the bank 175 may be effectively reduced.

In this regard, when the reflection structure RS is lower than the bank 175 as in the first embodiment, a light may pass through a portion between the reflection structure RS and the top surface of the bank 175 and leak.

In this embodiment, since the reflection structure RS is higher than the bank 175, a light leakage through a portion between the reflection structure RS and the top surface of the bank 175 can be reduced.

In this embodiment, for the purpose of explanations, the display device with the transparent second electrode 185 like the first embodiment is shown by way of example. Alternatively, the above configuration of the reflection structure RS may be applied to the display device with the semi-transparent second electrode like the second embodiment.

Fourth Embodiment

Figure 14:
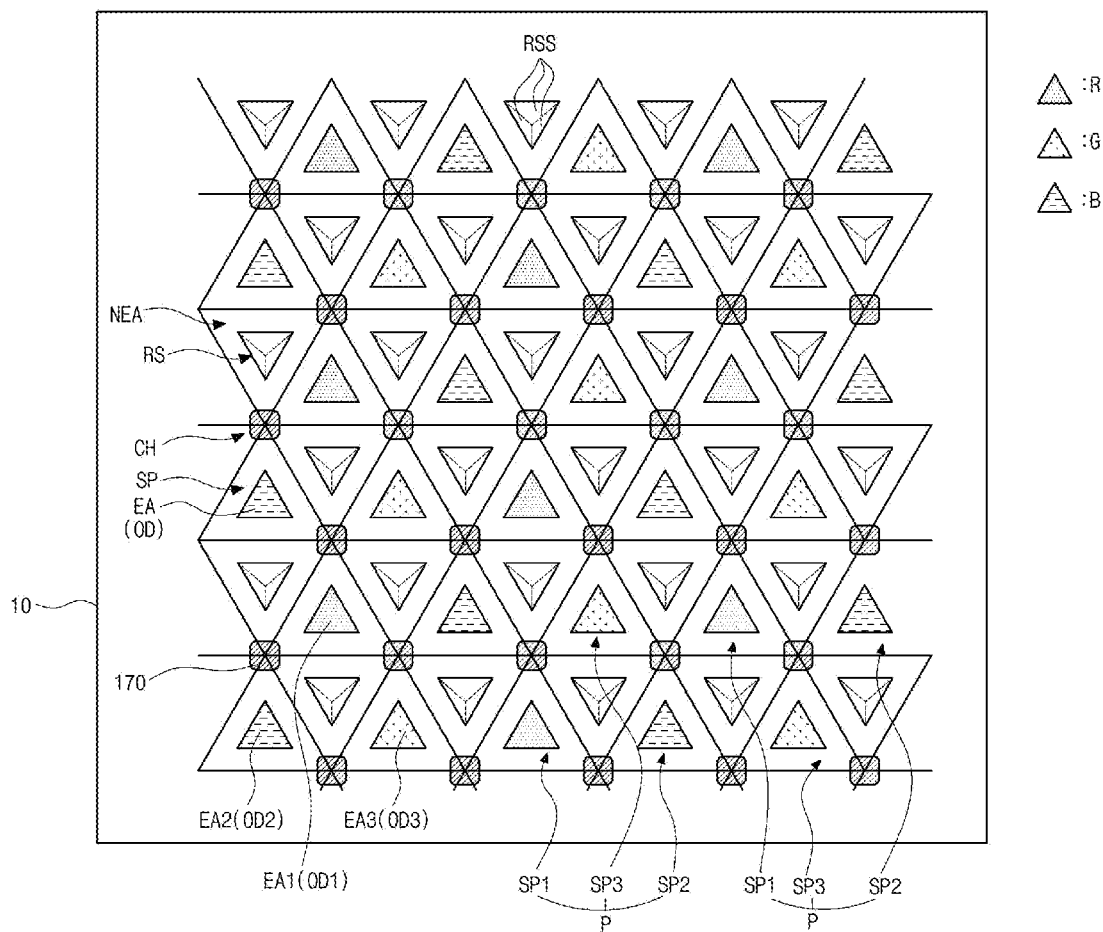
FIG. 14 is a plan view schematically illustrating a planar structure of an organic light emitting display device according to a fourth embodiment of the present disclosure.

FIG. 14 is a plan view schematically illustrating a planar structure of an organic light emitting display device according to a fourth embodiment of the present disclosure.

Explanations of the same or like parts of the first to third embodiments may be omitted.

Referring to FIG. 14, in the organic light emitting display device 10 of this embodiment, the sub-pixels SP may be arrayed in an arrangement other than the arrangement of the first to third embodiments. For example, the sub-pixels SP may be arrayed in a delta arrangement.

The emission region EA of each sub-pixel SP may be various in plan shape. For example, as shown in FIG. 14, the emission region EA may have, but not limited to, a triangular shape.

Regarding the delta arrangement, three sub-pixels SP adjacent to each other, for example, the first sub-pixel SP1 of the red (R) color, the second sub-pixel SP2 of the blue (B) color and the third sub-pixel SP3 of the green (G) color may form an arrangement unit of a delta shape.

In this regard, in one of an odd row line and an even row line as two neighboring row lines, for example, in an odd row line, the first, second and third sub-pixels SP1, SP2 and SP3 may be arranged alternately, and in an even row line, the first, second and third sub-pixels SP1, SP2 and SP3 may be arranged. Further, the sub-pixel SP in the odd row line may be located in a diagonal direction to the sub-pixel SP in the even row line which is different in color from the sub-pixel SP in the odd row line. In other words, in two neighboring row lines, the first, second and third sub-pixels SP1, SP2 and SP3 may be arranged in a zigzag form along a row direction.

Further, in each column line, the sub-pixels SP of the same color may be arranged. For example, the first, second and third sub-pixels SP1, SP2 and SP3 may be arranged in consecutive three column lines, respectively. Further, in two neighboring column lines, the two sub-pixels SP having different colors may be arranged in a zigzag form along a column direction.

As the sub-pixels SP may be arranged above, the delta-shaped arrangement unit, in which the first to third sub-pixels SP1 to SP3 are respectively located at three vertexes of the delta shape, may be defined. Further, the delta-shaped arrangement unit may be arrayed repeatedly in plane, and the neighboring arrangement units may be arrayed to share one vertex therebetween. For example, the neighboring arrangement units in the row direction may be arrayed to share one sub-pixel SP therebetween, and the neighboring arrangement units in the diagonal direction may be arrayed to share one sub-pixel SP therebetween. Accordingly, with respect to each sub-pixel SP, three delta-shaped arrangement units i.e., an arrangement unit at a lower side, an arrangement unit at a left and upper side and an arrangement unit at a right and upper side may share each sub-pixel SP.

In the above-described delta arrangement, the first to third sub-pixels SP1 to SP3 constituting the delta-shaped arrangement unit may form a pixel P which is a unit to display a color image. In this case, the neighboring pixels P may not share any sub-pixel SP. For example, as shown in FIG. 14, in two neighboring row lines as a pixel array unit, a pixel P having first to third sub-pixels SP1 to SP3 arranged in a delta shape, and a neighboring pixel P in the row direction having first to third sub-pixels SP1 to SP3 arranged in other delta shape (i.e., reverse delta shape), which is opposite in direction to the delta shape of the pixel P, may be arrayed alternately in the row direction. Further, a pixel P having delta-arranged first to third sub-pixels SP1 to SP3 may be arrayed repeatedly in the column direction.

As described above, in the delta arrangement, a number of the first sub-pixels SP1, a number of the second sub-pixel SP2 and a number of the third sub-pixels SP3 may be the same.

In the above delta arrangement, as an inside region of the delta-shaped arrangement unit, a non-emission region NEA which is surrounded by three sub-pixels SP forming the delta-shaped arrangement unit and has no light emission element may be defined.

In other words, each non-emission region NEA may be configured to be surrounded by three sub-pixels SP1 to SP3 arranged in a delta-shape in two row lines.

In the non-emission region NEA defined by its adjacent sub-pixels SP, the reflection structure RS may be configured. The reflection structure RS may have a polygonal pyramid shape, for example, a triangular pyramid shape, or a truncated polypyramid shape, for example, a truncated triangular pyramid shape.

The reflection structure RS may include the reflection side surfaces RSS respectively corresponding to the sub-pixels SP surrounding the reflection structure RS. In other words, in the reflection structure RS, the reflection side surfaces RSS may be arranged to respectively face three sub-pixels SP (i.e., the emission regions EA of the three sub-pixels SP).

In order to increase a reflection efficiency, in a plan view, each reflection side surface RSS may be configured to face the emission region EA of its corresponding sub-pixel SP straight ahead.

Further, the reflection side surface RSS may be configured to be inclined. In this regard, the reflection side surface RSS may be configured as an inclined surface that is slanted toward an inside of the reflection structure RS along an upper direction.

By forming the reflection side surface RSS to be inclined, a light output laterally from the corresponding sub-pixel SP may be reflected on the inclined reflection side surface RSS and then be output straight upward to a front of the display device.

As such, the reflection side surface RSS may serve like a light output portion which outputs a light produced from the corresponding sub-pixel SP to a display surface.

Because of such the reflection and output of light, an effect that a light output area of the sub-pixels SP expands planarly may be realized.

Accordingly, there may be an effect as if a distance between the same color sub-pixels SP were reduced, and thus a lattice recognition may be reduced.

Figure 15:
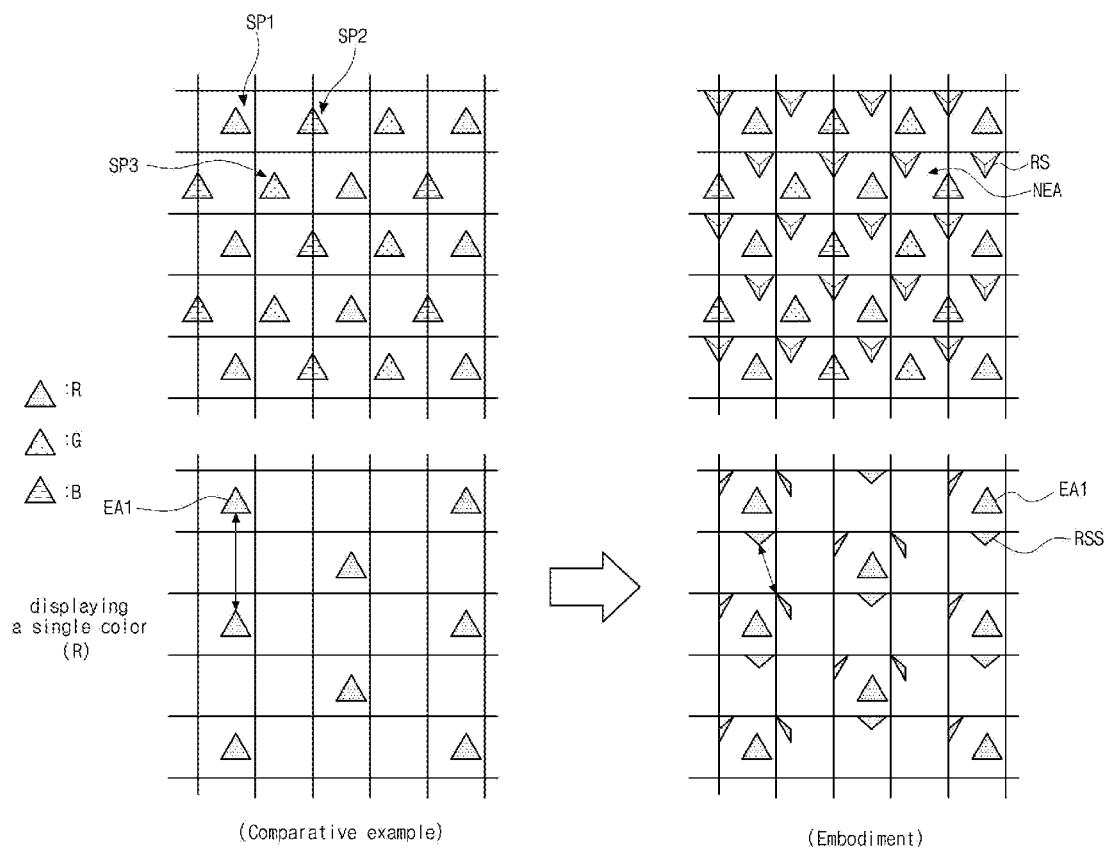
FIG. 15 is a view schematically illustrating regions displaying a red color when each of an organic light emitting display device of a comparative example and an organic light emitting display device of the fourth embodiment is operated to display a single color of a red color.

This may further refer to FIG. 15. FIG. 15 is a view schematically illustrating regions displaying a red color when each of an organic light emitting display device of a comparative example and the organic light emitting display device of the fourth embodiment is operated to display a single color e.g., a red color.

In the organic light emitting display device of the comparative example, a reflection structure is not formed at a non-emission region NEA which is surrounded by first, second and third sub-pixels SP1, SP2 and SP3 arranged in a delta shape.

When the organic light emitting display device of the comparative example is operated to display a single color of a red color, a red color light is output only at an emission region EA1 of a red-color sub-pixel SP1.

In the comparative example, a distance between the neighboring regions displaying the same color is as much as recognized by a viewer, and thus a lattice recognition occurs.

When the organic light emitting display device of this embodiment is operated to display a single color of a red color, a red color light is output at the emission region EA1 of the red-color first sub-pixel SP1 and is further output from the reflection side surface RSS of the reflection structure RS which is located at the non-emission region NEA adjacent to the emission region EA1.

As such, in this embodiment, an output region of a red color light includes the emission region EA1 of the first sub-pixel SP1 of a red color and can expand to a corresponding reflection region (i.e., a region of the corresponding reflection side surface RSS of the reflection structure RS) of the non-emission region NEA located in a lateral direction from the first sub-pixel SP1.

Compared with the comparative example, a distance between the neighboring regions displaying the same color can be reduced. Thus, a lattice recognition can be reduced by 2 times.

Accordingly, a lattice recognition which a viewer feels can be reduced significantly.

Further, by expansion of the light output region of the sub-pixel SP, when the organic light emitting display device is used as a virtual reality display device, an immersion of virtual reality can be improved.

Further, the non-emission region of the reflection structure RS serves as a light output region and acts as a display element like the sub-pixel SP. Thus, there is an effect of an increase of light transmittance and an increase of resolution as well.

Figure 16:
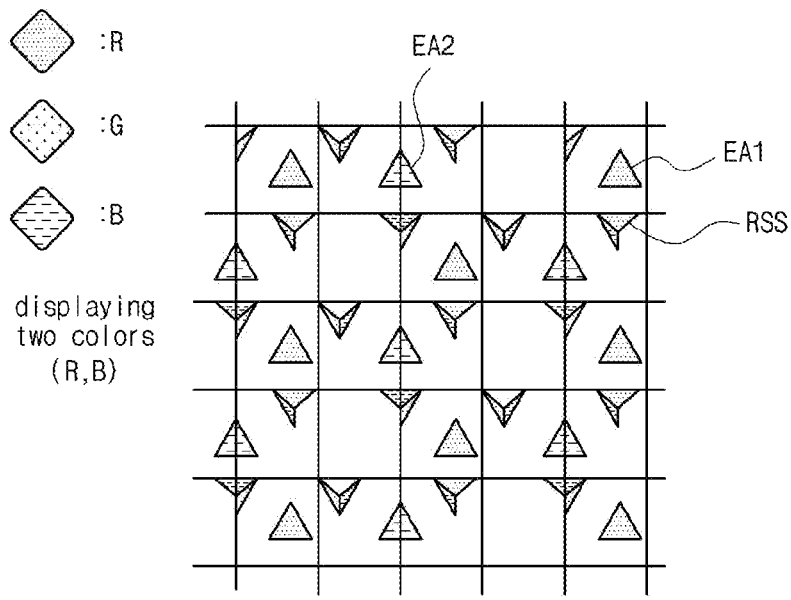
FIG. 16 is a view schematically illustrating an organic light emitting display device being operated to display two colors according to the fourth embodiment of the present disclosure.
Figure 17:
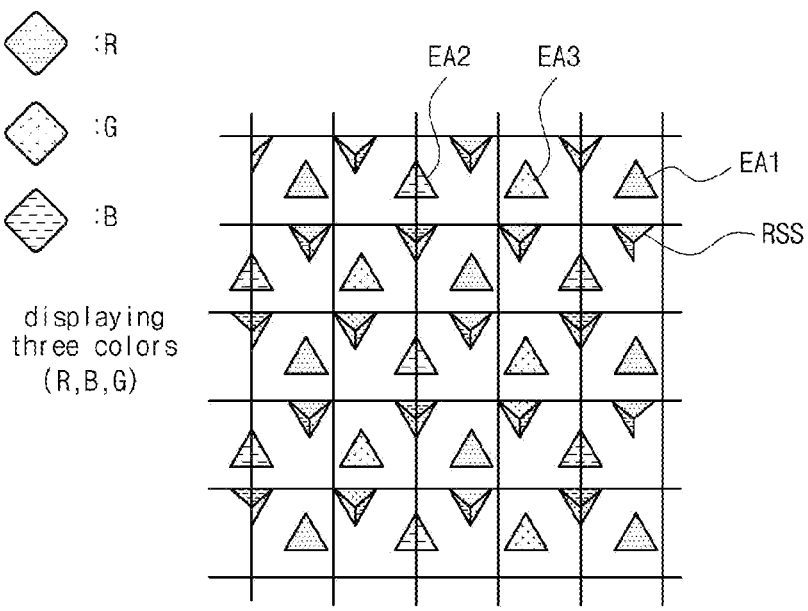
FIG. 17 is a view schematically illustrating an organic light emitting display device being operated to display three colors according to the fourth embodiment of the present disclosure.

FIG. 16 is a view schematically illustrating the organic light emitting display device being operated to display two colors according to the fourth embodiment of the present disclosure. FIG. 17 is a view schematically illustrating the organic light emitting display device being operated to display three colors according to the fourth embodiment of the present disclosure.

In FIG. 16, an operation to display two colors, for example, red color and blue color is shown by way of example. In this case, the emission region EA1 of the first sub-pixel SP1 outputs a red color light, and the emission region EA2 of the second sub-pixel SP outputs a blue color light. In addition, a red color light and a blue color light are output through the respective reflection side surfaces RSS of the reflection structure RS which are located at the non-emission region NEA adjacent to the first and second sub-pixels SP1 and SP2 and correspond to the first and second sub-pixels SP1 and SP2, respectively. As such, in the case of the operation to displaying two colors, a color light which is a mixed (or combined) color light of the emitted two color lights is output and seen.

In FIG. 17, an operation to display three colors, for example, red color, blue color and a green color is shown by way of example. In this case, the emission regions EA1, EA2 and EA3 of the first to third sub-pixels SP1 to SP3 output a red color light, a blue color light and a green color light. In addition, a red color light, a blue light and a green color light are output through the respective reflection side surfaces RSS of the reflection structure RS which are located at the non-emission region NEA adjacent to the first to third sub-pixels SP1 to SP3 and correspond to the first to third sub-pixels SP1 to SP3, respectively. As such, in the case of the operation to displaying three colors, a color light which is a mixed (or combined) color light of the emitted three color lights is output and seen.

As in the light emission operations of FIGS. 15 to 17, a color of a light through the reflection structure RS may change in accordance to a combination of emission states of the first to third sub-pixels SP1 to SP3 surrounding the reflection structure RS.

Referring back to FIG. 14, in each sub-pixel SP, an electrode contact hole CH may be formed outside the emission region EA. Through the electrode contact hole CH, a first electrode of the light emitting diode OD of each sub-pixel SP may be electrically connected to a driving transistor of each sub-pixel SP.

The electrode contact holes CH of the sub-pixels SP may be formed in the same direction and at the same position. For example, as shown in FIG. 14, each electrode contact hole CH may be located at a corner portion on a left and lower side of each emission region EA. The electrode contact hole CH may be filled with a light-shielding pattern 170.

In this embodiment using the delta arrangement, the organic light emitting display device 10 may not include any dummy holes of the first to third embodiments.

In this embodiment, for each sub-pixel SP (or for each emission region EA), three electrode contact holes CH each having the light-shielding pattern 170 therein may be located respectively at three separate regions between three reflection structures RS surrounding each sub-pixel SP. Accordingly, a light leakage that a color light of each sub-pixel SP enters its adjacent sub-pixels SP can be reduced, and an unwanted color mixing can be reduced.

A structure of each sub-pixel PS and a structure of the non-emission region NEA having the reflection structure RS may be similar to those of the first, second or third embodiment.

For example, like the first embodiment, a second electrode may be transparent, a reflection pattern may be formed on a top surface of a bank, and a light-shield layer may be formed on the reflection pattern.

Further, like the second embodiment, a second electrode may be semi-transparent, and no reflection pattern may be formed in the display device.

Further, like the third embodiment, a reflection structure may be formed to be higher than a bank and may protrude upward from the bank.

According to the above-described embodiments, the reflection structure is located in the non-emission region surrounded by the sub-pixels adjacent to the reflection structure and includes the reflection side surfaces facing the emission regions of the sub-pixels.

Since the reflection structure serves to reflect and output a light incident on the reflection side surfaces, an area of light output of the sub-pixels can substantially expand in plane.

Thus, there is an effect as if a distance between the same color sub-pixels were reduced, and thus a lattice recognition can be reduced.

Further, because of the expansion of the light output area of the sub-pixel, when the organic light emitting display device is applied to a virtual reality display device, an immersion of virtual reality can be improved.

Further, the non-emission region where the reflection structure is located serves as a light output region and acts as a display element like the sub-pixel. Thus, there is an effect of a resolution increase.

It will be apparent to those skilled in the art that various modifications and variations can be made in a display device of the present disclosure without departing from the sprit or scope of the disclosure. Thus, it is intended that the present disclosure covers the modifications and variations of this disclosure provided they come within the scope of the appended claims and their equivalents.

What is claimed is:

1. An organic light emitting display device, comprising:
light emitting diodes respectively located in first sub-pixels to third sub-pixels on a substrate and respectively light through emission regions of the first sub-pixels to the third sub-pixels;
a reflection structure located in a non-emission region surrounded by the first sub-pixels to the third sub-pixels and including reflection side surfaces which are inclined and respectively face the emission regions of the first sub-pixels to the third sub-pixels, and
a bank which is formed at the non-emission region and includes openings respectively defining the emission regions of the first sub-pixels to the third sub-pixels,
wherein at least one of the light emitting diodes includes:
a first electrode which is reflective, is exposed through a corresponding opening from the openings, and includes an electrode extension portion located below the bank and extending to the non-emission region; and
an organic light emitting layer which is located on the first electrode; and
a second electrode located on the organic light emitting layer,
wherein the second electrode is located on the bank and is transparent, and
wherein a reflection pattern is formed on the bank and includes a through hole corresponding to the reflection structure.

2. The display device of claim 1,
wherein the reflection structure includes a protrusion pattern which has a taper shape and protrudes upward, and a reflection part covering the protrusion pattern, and
wherein the reflection part is a part of the electrode extension portion of the first electrode which is included in one of the first to third sub-pixels.

3. The display device of claim 1, wherein a light-shielding layer is formed on the reflection pattern and includes the through hole corresponding to the reflection structure.

4. The display device of claim 1, wherein the first to third sub-pixels respectively emit red light, green light, and blue light output upward through the emission regions of the first sub-pixels to the third sub-pixels, and
wherein the first sub-pixels to the third sub-pixels are arrayed in a diamond pentile arrangement or delta arrangement.

5. The display device of claim 4, wherein when the first sub-pixels to the third sub-pixels are arrayed in the diamond pentile arrangement, the non-emission region is surrounded by the first sub-pixels and second sub-pixels located opposite to each other and two third sub-pixels located opposite to each other.

6. The display device of claim 4, wherein when the first sub-pixels to the third sub-pixels are arrayed in the delta arrangement, the non-emission region is surrounded by the first sub-pixels to the third sub-pixels forming a delta shape.

7. The display device of claim 4, further comprising:
a transistor in each of the first sub-pixels to the third sub-pixels; and
a passivation layer located between the transistor and the light emitting diode, and including an electrode contact hole through which the transistor is connected to a reflective first electrode of the light emitting diode,
wherein the electrode contact hole is filled with a light-shielding pattern.

8. The display device of claim 7, wherein the electrode contact hole is located at a corner portion on a side of the corresponding sub-pixel.

9. The display device of claim 8, wherein when the first sub-pixels to the third sub-pixels are arrayed in the diamond pentile arrangement, a dummy hole is formed in the passivation layer, is located at a corner portion on a side of the non-emission region, and is filled with another light-shielding pattern, and
wherein a location of the dummy hole in the non-emission region corresponds to the location of the electrode contact hole in the sub-pixel.

10. The display device of claim 1, wherein a color of a light output through the reflection structure is in accordance to a combination of emission states of the first sub-pixels to the third sub-pixels.

11. The display device of claim 1, wherein areas of the emission regions of the first sub-pixels to the third sub-pixels are different.

12. The display device of claim 1, wherein each reflection side surface reflects a light incident thereon from the corresponding emission region from the emission regions upward.

13. An organic light emitting display device, comprising:
light emitting diodes respectively located in first sub-pixels to third sub-pixels on a substrate and respectively emitting light through emission regions of the first sub-pixels to the third sub-pixels;
a reflection structure located in a non-emission region surrounded by the first sub-pixels to the third sub-pixels and including reflection side surfaces which are inclined and respectively face the emission regions of the first sub-pixels to the third sub-pixels; and
a bank which is formed at the non-emission region and includes openings respectively defining the emission regions of the first sub-pixels to the third sub-pixels,
wherein at least one of the light emitting diodes includes:
a first electrode which is reflective, is exposed through a corresponding opening from the openings, and includes an electrode extension portion located below the bank and extending to the non-emission region; and
an organic light emitting layer which is located on the first electrode; and
a second electrode located on the organic light emitting layer, and
wherein the second electrode is located on the bank, is semi-transparent, and includes a through hole corresponding to the reflection structure.

14. The display device of claim 13, wherein the reflection structure includes a protrusion pattern which has a taper shape and protrudes upward, and a reflection part covering the protrusion pattern, and
wherein the reflection part is a part of the electrode extension portion of the first electrode which is included in one of the first to third sub-pixels.

15. An organic light emitting display device, comprising:
light emitting diodes respectively located in first sub-pixels to third sub-pixels on a substrate and respectively emitting light through emission regions of the first sub-pixels to the third sub-pixels;
a reflection structure located in a non-emission region surrounded by the first sub-pixels to the third sub-pixels and including reflection side surfaces which are inclined and respectively face the emission regions of the first sub-pixels to the third sub-pixels; and
a bank which is formed at the non-emission region and includes openings respectively defining the emission regions of the first sub-pixels to the third sub-pixels,
wherein at least one of the light emitting diodes includes:
a first electrode which is reflective, is exposed through a corresponding opening from the openings, and includes an electrode extension portion located below the bank and extending to the non-emission region; and
an organic light emitting layer which is located on the first electrode; and
a second electrode located on the organic light emitting layer,
wherein the reflection structure has a height greater than that of the bank.

16. The display device of claim 15, wherein the reflection structure includes a protrusion pattern which has a taper shape and protrudes upward, and a reflection part covering the protrusion pattern, and
wherein the reflection part is a part of the electrode extension portion of the first electrode which is included in one of the first to third sub-pixels.

* * * * *